(12) United States Patent
Crombez

(10) Patent No.: US 9,751,424 B2
(45) Date of Patent: Sep. 5, 2017

(54) METHOD AND SYSTEM FOR DETERMINING A TARGET STATE OF CHARGE TO CHARGE A BATTERY IN A VEHICLE USING EXTERNAL ELECTRIC POWER

(75) Inventor: Dale Scott Crombez, Livonia, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 1646 days.

(21) Appl. No.: 13/182,486

(22) Filed: Jul. 14, 2011

(65) Prior Publication Data

US 2013/0015860 A1 Jan. 17, 2013

(51) Int. Cl.
| | |
|---|---|
| B60L 11/18 | (2006.01) |
| H01M 10/44 | (2006.01) |
| B60L 7/10 | (2006.01) |
| G01R 31/36 | (2006.01) |
| H01M 10/48 | (2006.01) |

(52) U.S. Cl.
CPC ............ B60L 11/1862 (2013.01); B60L 7/10 (2013.01); B60L 11/1838 (2013.01); G01R 31/36 (2013.01); H01M 10/44 (2013.01); B60L 2240/62 (2013.01); B60L 2240/662 (2013.01); B60L 2250/00 (2013.01); B60L 2260/54 (2013.01); H01M 10/48 (2013.01); Y02T 10/705 (2013.01); Y02T 10/7005 (2013.01); Y02T 10/7044 (2013.01); Y02T 10/7072 (2013.01); Y02T 10/7291 (2013.01); Y02T 90/121 (2013.01); Y02T 90/128 (2013.01); Y02T 90/14 (2013.01); Y02T 90/16 (2013.01); Y02T 90/162 (2013.01); Y02T 90/163 (2013.01)

(58) Field of Classification Search
None
See application file for complete search history.

(56) References Cited

U.S. PATENT DOCUMENTS

| | | | |
|---|---|---|---|
| 6,181,991 B1 | 1/2001 | Kondo et al. | |
| 6,583,599 B1 | 6/2003 | Phillips et al. | |
| 6,963,186 B2 | 11/2005 | Hobbs | |
| 7,193,391 B2 | 3/2007 | Moore | |
| 2006/0278449 A1 | 12/2006 | Torre-Bueno | |
| 2009/0319110 A1* | 12/2009 | Tani et al. | 701/22 |
| 2011/0022259 A1 | 1/2011 | Niwa | |
| 2011/0264317 A1* | 10/2011 | Druenert et al. | 701/22 |
| 2011/0282527 A1* | 11/2011 | Inbarajan et al. | 701/22 |

* cited by examiner

Primary Examiner — Khoi Tran
Assistant Examiner — Kelly D Williams
(74) Attorney, Agent, or Firm — David Kelley; Brooks Kushman P.C.

(57) ABSTRACT

A system and method is provided for determining a target state of charge (SOC) to charge a storage battery in an electric vehicle using electric power from an external power source. Charging the storage battery to the target SOC occurs prior to starting a drive cycle of the vehicle. The target SOC is determined based on a profile of regenerative braking energy expected to be recovered and a profile of energy expected to be used from the battery during a portion of a future drive cycle.

20 Claims, 6 Drawing Sheets

METHOD AND SYSTEM FOR DETERMINING A TARGET STATE OF CHARGE TO CHARGE A BATTERY IN A VEHICLE USING EXTERNAL ELECTRIC POWER

TECHNICAL FIELD

Determining a target state of charge (SOC) to charge a storage battery in an electric vehicle.

BACKGROUND

An electric vehicle generally includes an electric motor and a high-voltage storage battery. The high-voltage storage battery has a state of charge (SOC) and provides electric power to the electric motor to drive the vehicle. The SOC of the battery decreases when the battery provides electric power to drive the vehicle.

When the SOC of the battery decreases during a drive cycle, it may be desirable to capture the kinetic energy of the vehicle and convert the kinetic energy to electric energy to recharge the battery, such as during vehicle braking. However, the battery is unable to store the kinetic energy of the vehicle if the battery is at full capacity. For example, the battery may have a full capacity at a 100% charge level and be unable to store braking energy during a drive cycle that starts with the vehicle atop of a hill.

A power source external to the vehicle, such as a household power outlet on the GRID, may be used to charge or recharge the battery to the 100% charge level. However, it may be desirable or necessary to use the external power source to charge the battery to a target SOC below the 100% charge level prior to a drive cycle to allow the battery to recover braking energy during the drive cycle, such as when the vehicle start the drive cycle atop of the hill.

SUMMARY

Embodiments of the present disclosure generally provide a method and system for determining a target state of charge (SOC) to charge a storage battery in an electric vehicle using electric power from a power source that is external to the vehicle. In addition, at least one logic storage medium having logic-device-readable code embodied thereon is provided for performing the method of determining the target SOC.

A profile of regenerative braking energy expected to be recovered during a portion of a future drive cycle of the vehicle is determined. Likewise, a profile of energy expected to be used from the battery during the portion of the future drive cycle is determined. Based on the profiles of energy determined, the target SOC to charge the battery prior to starting the drive cycle is determined.

The target SOC may be based an amount of regenerative braking energy expected to be recovered in an initial portion of the future drive cycle. The initial portion of the future drive cycle may be determined to be the portion of the future drive cycle from the beginning of the drive cycle to a time interval where the profile of energy expected to be used from the battery substantially exceeds the profile of regenerative braking energy expected to be recovered within the time interval.

A charge rate to charge the battery during the initial portion of the future drive cycle may be determined based on the regenerative braking energy expected to be recovered, such as during the initial portion of the future drive cycle.

Furthermore, the charge rate may be determined based on an amount of battery energy required to complete the future drive cycle. The target SOC may be determined in response to the charge rate. The target SOC may be calculated as being inversely proportional to the charge rate determined.

An amount of battery energy required to complete the future drive cycle may be determined. The target SOC may be determined to be an upper limit of a predetermined operating range of SOC when the upper limit provides at least the amount of battery energy required to complete the future drive cycle. Furthermore, the target SOC may be determined in an effort to maximize time that the battery operates in the predetermined operating range of SOC during the future drive cycle. The predetermined range of SOC may be between ten percent (10%) and ninety percent (90%) of the maximum SOC of the battery.

The target SOC may be determined in an effort to maximize the amount of regenerative braking energy that the vehicle captures during the future drive cycle. Information indicating an expected travel path of the vehicle during the drive cycle may be processed. The information indicating the expected travel path may include information indicating lengths and grades for respective sections of the expected travel path, one or more user inputs including information indicating an intended destination of the vehicle, amounts of regenerative braking energy recovered during previous drive cycles of the vehicle occurring along at least a portion of the expected travel path, a time of day when the amounts of regenerative braking energy were recovered in the previous drive cycle, a day of week when the amounts of regenerative braking energy were recovered in the previous drive cycle, or a combination thereof. The profile of regenerative braking energy expected to be recovered and the profile of energy expected to be used may be determined based on the expected travel path.

The system includes at least one logic device. The logic device determines the target SOC to charge the battery prior to starting a drive cycle of the vehicle using the electric power from the external power source. The target SOC is based on the profiles of regenerative braking energy expected to be recovered and to be used during the portion of the future drive cycle. The logic device may be a controller that includes a processor operable to execute software instructions, a computer memory operable to store software instructions accessible by the processor, and a set of software instructions stored in the memory to determine the target SOC.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Embodiments of the present disclosure generally provide a method and system for determining a target state of charge (SOC) to charge a storage battery in an electric vehicle using electric power from an external power source. Charging the storage battery to the target SOC occurs prior to starting a drive cycle of the vehicle.

Figure 1:
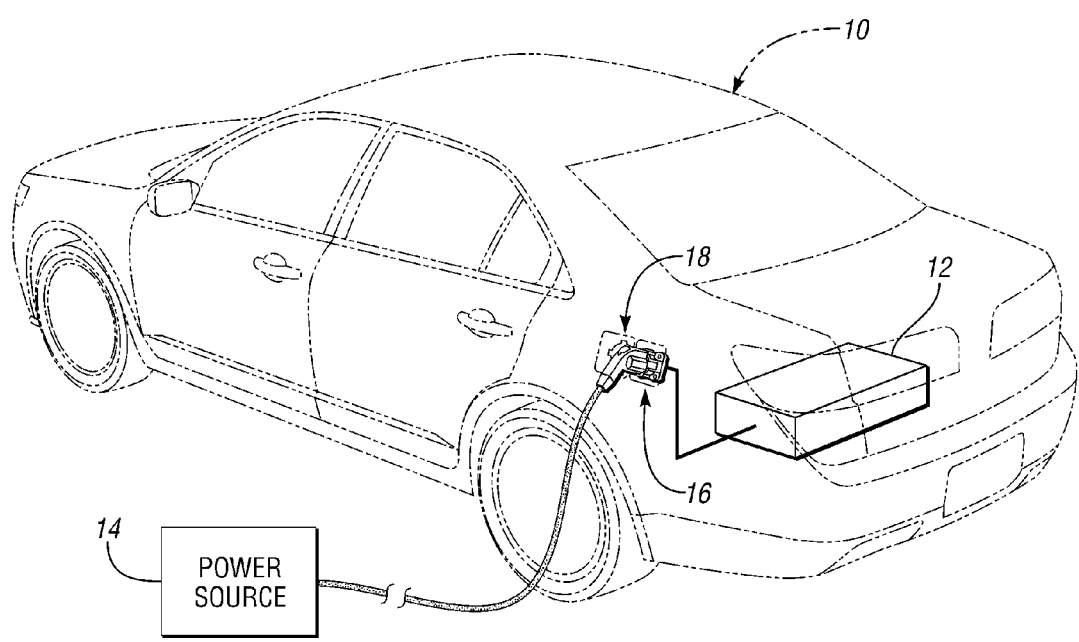
FIG. 1 is a schematic diagram illustrating an electric vehicle with a storage battery and a power source external to the vehicle for charging the storage battery to a target state of charge (SOC) in accordance with one embodiment.

With reference to FIG. 1, an electric vehicle 10 (hereinafter "vehicle") is provided with a charging system 12. The vehicle 10 may be any type of electric vehicle that can be electrically coupled or connected to a power source 14 that is external to the vehicle 10 (hereinafter "external power source"). For example, the vehicle 10 may be a plug-in electric vehicle, a plug-in hybrid electric vehicle (PHEV), other plug-in vehicle, a battery electric vehicle (BEV), a pure electric vehicle, et cetera. The phrase "plug-in vehicle" refers to any type of automotive vehicle that can connect to the external power source 14 to receive electric power from the external power source 14. Thus, for example, the vehicle 10 may be a vehicle that includes a charge port 16 to receive a charge plug 18 to transfer electric power from the external power source 14, through the charge plug 18, and into the vehicle 10.

Figure 2:
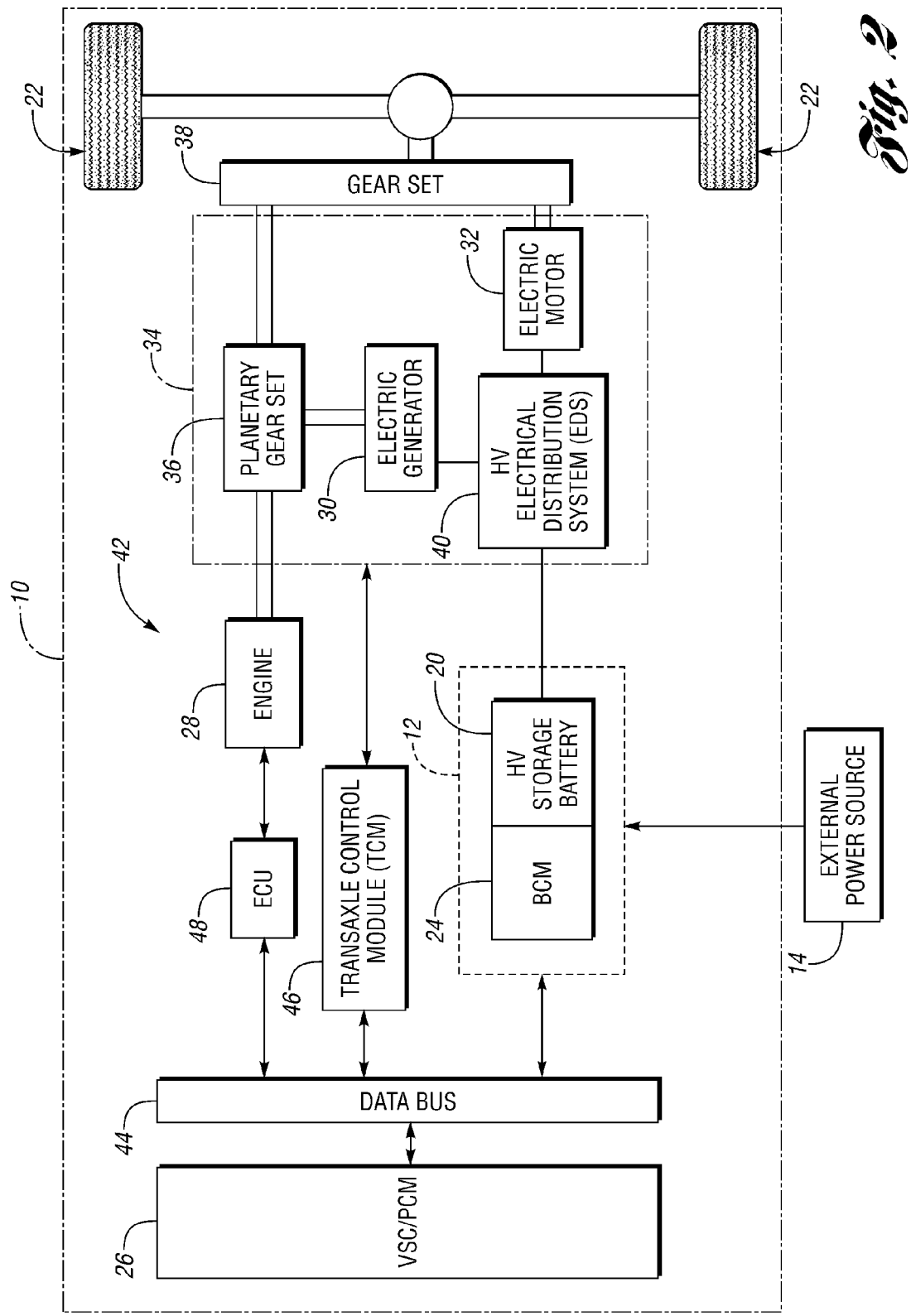
FIG. 2 is a schematic diagram illustrating a system including at least one logic device for charging the storage battery to the target SOC using the external power source in accordance with one embodiment.

As illustrated in FIG. 2, the charging system 12 is shown integrated with a powertrain of a parallel/series hybrid electric vehicle (PSHEV). However, the system 12 can be integrated with any type of electric vehicle. For example, the vehicle 10 may be a series hybrid electric vehicle (SHEV), a parallel hybrid electric vehicle, or a pure electric vehicle.

With reference to FIGS. 1-2, the external power source 14 can provide electric power to the vehicle 10. For example, the external power source 14 may be a charging station or a standard household electrical outlet that is electrically connected to the GRID. The GRID steps down electric power from a high voltage, such as 7200 volts, to a lower voltage, such as 240 volts. In addition, the external power source 14 may be a direct current (DC) power source and/or an alternating current (AC) power source. For example, the external power source 14 may be a 120-volt AC power outlet or 240-volt AC power outlet. In another example, the external power source 14 may be a 300-volt DC power outlet.

As shown in FIG. 2, the vehicle 10 includes a high-voltage storage battery 20 (hereinafter "HV battery"). Being a device that can store electric energy, the HV battery 20 has a state of charge (SOC). The SOC of the HV battery 20 varies depending on the amount of electric energy in the HV battery 20. A battery charge level may represent the SOC of the HV battery 20 as a percentage of the electric capacity of the HV battery 20. For example, the battery charge level may range from zero percent (0%) to one-hundred percent (100%).

In operation, the HV battery 20 stores electric energy or outputs electric power to various components in the vehicle 10. For example, the HV battery 20 can provide power to drive wheels 22 so that the vehicle 10 can be propelled. In such an example, the HV battery 20 may provide 300-volt DC power to drive the wheels 22 and propel the vehicle 10. As the HV battery 20 outputs electric energy or provides electric power, the SOC of the HV battery 20 decreases and, therefore, the battery charge level decreases. However, electric power from the external power source 14 may be used to charge or increase the SOC of the HV battery 20 between drive cycles of the vehicle 10.

With continuing reference to FIG. 2, the vehicle 10 may include a battery control module 24 (hereinafter "BCM"). The BCM 24 controls the HV battery 20 either alone or in conjunction with a vehicle system controller (VSC), a powertrain control module (PCM), or a combination thereof. The combination of the VSC and the PCM is hereinafter referenced as a "VSC/PCM" having reference numeral 26.

The BCM 24 of FIG. 2 can control the HV battery 20 to output electric power, store electric power, receive electric power from the external power source 14, or a combination thereof. In addition, the BCM 24 can control the battery charge level of the HV battery 20 to increase the SOC, to maintain the SOC, or to decrease the SOC of the HV battery 20. For example, the BCM 24 can control when and/or how much electric power from the external power source 14 is used to charge or recharge the HV battery 20 to a target SOC. The target SOC may be determined based on a number of variables or inputs. The BCM 24, the VSC/PCM 26, or a combination of both may be used to determine or calculate the target SOC for the HV battery 20. Furthermore, the BCM 24, either alone or in combination with the VSC/PCM 26, can be used to charge the HV battery 20 to the target SOC.

While the BCM 24 and the HV battery 20 of FIG. 2 are shown as part of the charging system 12, the BCM 24 may be separate from the charging system 12. Furthermore, the BCM 24 and the VSC/PCM 26 may be integrated together to operate as a single hardware device in the vehicle 10.

Referring again to FIG. 2, the vehicle 10, such as the parallel/series hybrid electric vehicle (PSHEV) depicted in FIG. 2, may include an engine 28. The engine 28 and the HV battery 20 can selectively provide power to the drive wheels 22 so that the vehicle 10 can be propelled. In operation, the HV battery 20 may receive electric power from an electric generator 30, output electric power to an electric motor 32, and power other electric-based devices in the vehicle 10.

As shown in FIG. 2, the vehicle 10 includes a transaxle 34. The transaxle 34 is analogous to a transmission in a conventional vehicle. The transaxle 34 can include the electric generator 30, the electric motor 32, a planetary gear set 36, and a gear set 38. The transaxle 34 of FIG. 2 is coupled between the drive wheels 22 and the engine 28 and HV battery 20 to control how and when power is transferred to the drive wheels 22. The electric motor 32 and the electric generator 30 are two electric machines that make up an electric machine arrangement. Thus, the motor 32 and the electric generator 30 each represent a portion of the electric machine arrangement. However, the vehicle 10 may have different electric machine arrangements, such as more or fewer than two electric machines.

With continuing reference to FIG. 2, the planetary gear set 36 of the transaxle 34 mechanically couples the engine 28, the drive wheels 22 through gear set 38, and the electric generator 30. For example, the electric generator 30 may be connected to a sun gear of the planetary gear set 36 while the engine 28 and the drive wheels 22 are respectively connected to a planetary carrier and a ring gear of the planetary gear set 36.

As depicted in FIG. 2, the vehicle 10 may include a high-voltage electrical distribution system 40 (hereinafter "EDS"). The EDS 40 can receive the electric energy from the electric generator 30 and distribute the electrical energy between the HV battery 20 and the electric motor 32, depending on the driving mode of the vehicle 10. The EDS 40 can also receive electric energy from the HV battery 20 and/or the electric motor 32 and distribute the electric energy to the charging system 12, the electric motor 32, the electric generator 30, or a combination thereof.

As shown in FIG. 2, the vehicle 10 includes at least one logic device (LC) or controller 42 to implement the method of determining the target SOC to charge the HV battery 20 in the electric vehicle 10. The controller or LD 42 can be implemented by various types or combinations of electronic devices and/or microprocessor-based computers or controllers. To implement the method of determining the target SOC to charge the HV battery 20, the controller 42 may execute a computer program or algorithm or control logic embedded or encoded with the method and stored in volatile and/or persistent memory. Alternatively, control logic may be encoded in a logic or gate array stored on one or more integrated circuit chips. The control logic may be implemented in software, hardware, or a combination of software and hardware in one or more controllers and/or electronic devices depending upon the particular application. When implemented in software, the control logic is preferably provided in one or more computer-readable storage media having stored data representing code or instructions executed by a computer to control charging of the HV battery 20. The computer-readable storage media may include one or more of a number of known physical devices which utilize electric, magnetic, optical, and/or hybrid storage to keep executable instructions and associated calibration information, operating variables, and the like.

The controller 42 of FIG. 2 is shown to include the BCM 24. Although the controller 42 is shown as a single hardware device, the controller 42 may include multiple logic devices in the form of multiple hardware devices, or multiple software logic devices within one or more hardware devices. For example, the controller 42 may include the VSC/PCM 26, the battery control module (BCM) 24, another controller in the vehicle 10, or some combination thereof. Thus, the controller 42 may be integrated as part of the charging system 12 or the controller 42 may be separate from the charging system 12.

As illustrated in FIG. 2, the VSC/PCM 26 may control a number of components or devices in the vehicle 10 through a vehicle data bus 44 (hereinafter "data bus"). For example, the VSC/PCM 26 controls the charging system 12, the transaxle 34 through a transaxle control module (TCM) 46, and the engine 28 through an engine control unit (ECU) 48. The data bus 44 is in communication with various components in the vehicle 10 including the controller 42, the TCM 46, and the ECU 48. The data bus 44 may be implemented as a controller area network (CAN), a local interconnect network (LIN), or any such suitable data-communication link that can transfer data between the VSC/PCM 26 and other devices in the vehicle 10.

The BCM 24 controls electric energy flow to and from the HV battery 20. For example, the BCM 24 can control when the HV battery 20 outputs and stores high-voltage electric power. The charging system 12 may include one or more power converters to receive electric power from the external power source 14 and to convert the power to a more suitable form of power to charge the HV battery 20. For example, the BCM 24 may control an AC-to-DC converter in the charging system 12 to control charging of the HV battery 20 using alternating current (AC) electric power from the external power source 14. In another example, the BCM 24 may control a DC-to-DC converter 56 to control charging of the HV battery 20 using direct current (DC) electric power from the external power source 14.

The VSC/PCM 26 and the TCM 46 operate to control the various modes of the transaxle 34, such as operation of an electric drive mode of the vehicle 10 during a drive cycle. The electric drive mode of the vehicle 10 allows the electric motor 32 to operate as a motor, as a generator to provide electric power to operate the vehicle 10, or as both. The electric drive mode of the vehicle 10 can be used to drive the drive wheels 22 and propel the vehicle 10. In addition, the charging system 12 can charge the HV battery 20 using power from the EDS 40 during a regenerative braking mode of the vehicle 10 or from the external power source 14 prior to driving the vehicle 10 from one location to another.

Figure 3:
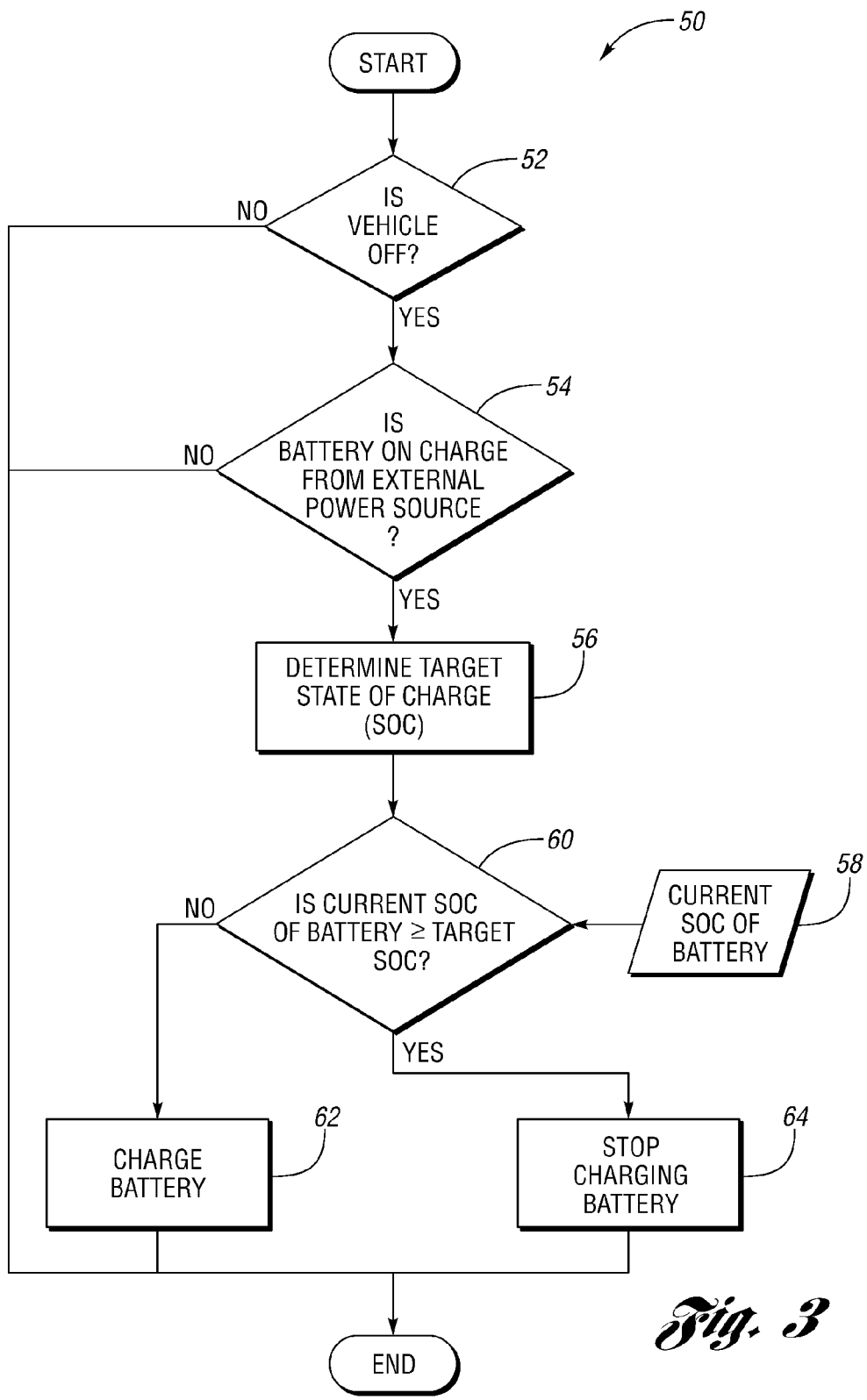
FIG. 3 is a flowchart diagram illustrating a general method of determining whether to charge the storage battery in accordance with one embodiment.

With reference to FIG. 3, a flowchart diagram 50 is provided to illustrate operation of the controller 42 and/or the charging system 12 as well as steps of a general method of determining whether to charge the HV battery 20 in accordance with one embodiment. The vehicle 10 and components illustrated in FIGS. 1-2 may be referenced throughout the discussion of the method to facilitate understanding of various aspects of the method. The diagram of FIG. 3 provides a representative control strategy for determining whether to charge the HV battery 20, such as to the target SOC.

At decision block 52 of flowchart diagram 50, whether the vehicle 10 is off is determined. The vehicle 10 may be determined to be off when the transaxle 34 and/or the engine 28 is not operating to drive the wheels 22 of the vehicle 10. The VSC/PCM 26 either alone or in combination with the TCM 46 and/or ECU 48 may be used to determine whether the vehicle 10 is off. If the vehicle 10 is determined to be off, then decision block 54 occurs.

At decision block 54 illustrated in FIG. 3, whether the HV battery 20 is "on charge" or charging from the external power source 14 is determined. The BCM 24 either alone or in combination with the VSC/PCM 26 may be used to determine whether the HV battery 20 is "on charge" or charging from the external power source 14. For example, the vehicle 10 may be determined to be "on charge" when the charge port 16 has received the charge plug 18. Thus, the vehicle 10 may be "on charge" even when no electric power is being transferred from the external power source 14 to the HV battery 20. If the HV battery 20 is "on charge" or charging from the external power source 14, then block 56 occurs.

Figure 7:
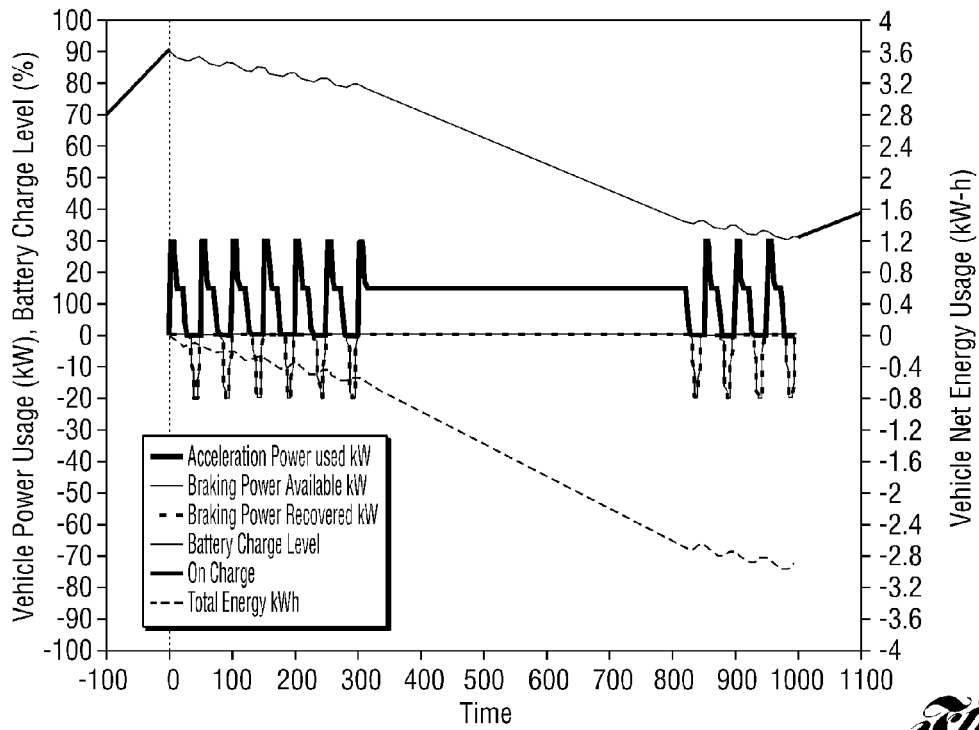
FIG. 7 is a diagram similar to FIG. 5, but illustrating the storage battery at a 90% charge level prior to starting the drive cycle in accordance with one embodiment.
Figure 8:
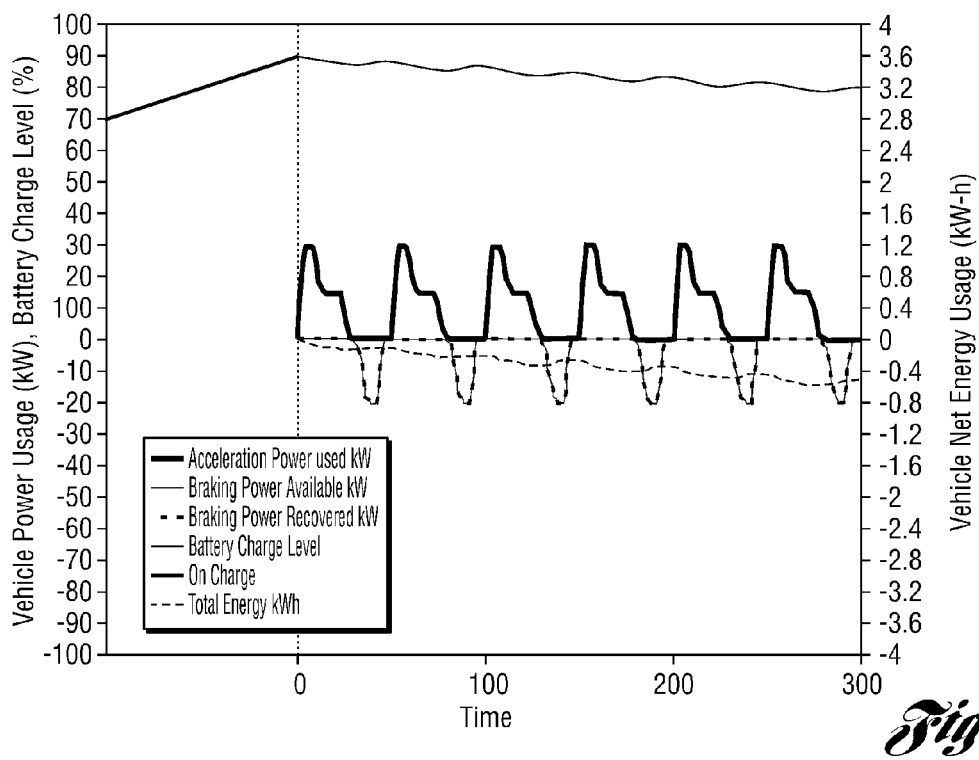
FIG. 8 is a diagram illustrating an initial portion of the drive cycle shown in FIG. 7 and the storage battery recovering substantially all of the regenerative braking energy during the first two vehicle stops without the battery being charge limited as in FIGS. 5-6, in accordance with one embodiment.

At block 56, a target state of charge (SOC) is determined. For example, the target SOC may be ninety percent (90%). FIGS. 7-8 illustrate the HV battery 20 having a target SOC of 90% at the start of the drive cycle (i.e., time=0) of the vehicle 10. The BCM 24, the VSC/PCM 26, or a combination of both may be used to determine or calculate the target SOC for the HV battery 20 based on a number of variables or inputs. Block 56 (depicted in FIG. 3) may correspond to flowchart diagram 70 (depicted in FIG. 4).

At block 58, the current SOC of the HV battery 20 is obtained and provided to block 58. For example, the current SOC may be nine percent (9%) at a relatively low charge level or ninety-seven percent (97%) at a relatively high charge level. The BCM 24 may obtain the current SOC of the HV battery 20 for the LD or controller 42 and/or charging system 12. Thus, the controller 42 may obtain the current SOC of the HV battery 20 either internally or from a signal that the controller 42 receives external to the controller 42, such as from the BCM 24, depending on the configuration of the controller 42.

At decision block 60, whether the current SOC of the HV battery 20 is greater than or equal to the target SOC is determined. The BCM 24, the VSC/PCM 26, the charging system 12, or a combination thereof may be used to determine whether the current SOC of the HV battery 20 is greater than or equal to the target SOC. If the current SOC of the HV battery 20 is less than the target SOC, then the charging system 12 starts charging the HV battery 20 or continues to charge the HV battery 20 at block 62. In contrast, if the current SOC of the HV battery 20 is greater than or equal to the target SOC, then the charging system 12 stops charging the HV battery 20 at block 64. Thus, the target SOC can be used to control when to charge the HV battery 20 as well as how much electric power from the external power source 14 is used to charge the HV battery 20.

At block 62, the HV battery 20 charges. The HV battery 20 either starts charging or continues to charge using electric power from the external power source 14. The charging system 12 and/or the BCM 24 can charge the HV battery 20 to the target SOC. Block 62 may repeatedly return to block 52 until the HV battery 20 achieves at least the target SOC, the vehicle 10 is determined to be off, or the HV battery 20 is determined to no longer be "on charge" or charging from the external power source 14.

At block 64, the charging system 12 stops charging the HV battery 20. For example, the charging system 12 and/or the BCM 24 may be used interrupt the transfer of electric power from the external power source 14 to the HV battery 20 to stop charging the HV battery 20. Block 64 may return to block 52 to monitor the status of the vehicle 10 and/or HV battery 20.

Figure 4:
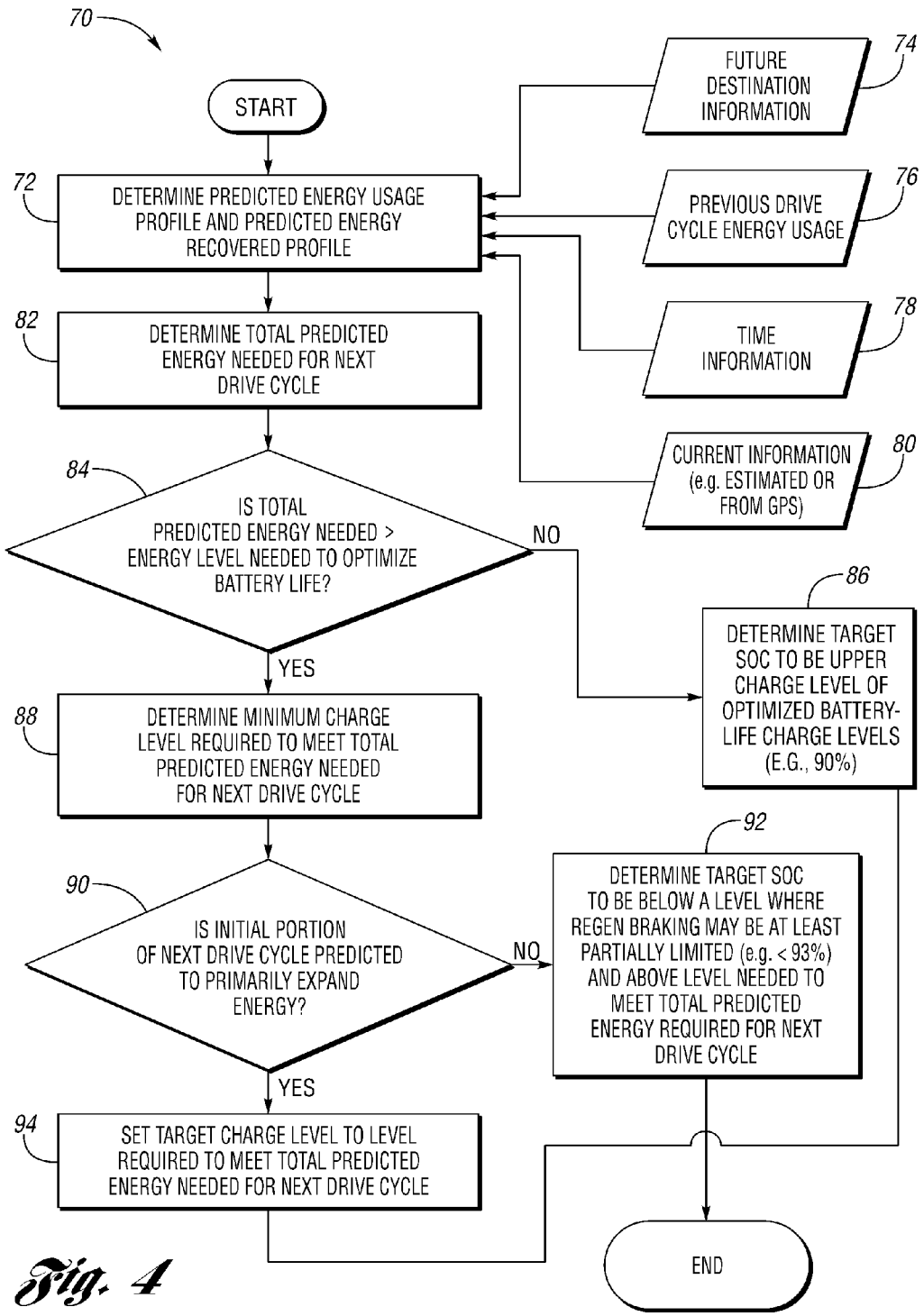
FIG. 4 is a flowchart diagram illustrating a method of determining the target SOC to charge the storage battery in accordance with one embodiment.

With reference to FIG. 4, a flowchart diagram 70 is provided to illustrate steps of a method of determining the target state of charge (SOC) to charge the HV battery 20 using electric power from the external power source 14. The vehicle 10 and components illustrated in FIGS. 1-2 may be referenced throughout the discussion of the method to facilitate understanding of various aspects of the method. One or more steps illustrated in flowchart diagram 70 may correspond to block 46 of flowchart diagram 50 (depicted in FIG. 3).

At block 72, a predicted energy usage profile and a predicted energy recovered profile are determined. The predicted energy usage profile includes a profile of energy expected to be used from the HV battery 20 during the next drive cycle of the vehicle 10. The profile of energy expected to be used may be obtained over a predetermined initial portion of the next drive cycle or over the entire next drive cycle. The predetermined initial portion of the future drive cycle may be determined to be the portion of the future drive cycle from the beginning of the drive cycle to a time interval where the profile of energy expected to be used from the HV battery 20 substantially exceeds the profile of regenerative braking energy expected to be recovered within the time interval. The predicted energy used is energy transmitted from the HV battery 20, for example, to the EDS 40 to drive the electric motor 32. In another example, energy stored in the HV battery 20 may be used to drive the electric generator 30 via the EDS 40. The controller 42 and/or the VSC/PCM 26 may be used to determine the predicted energy usage profile based on a number of information or inputs, such as information from blocks 74, 76, 78, and 80.

Referring again to block 72, the predicted energy recovered profile includes a profile of regenerative braking energy expected to be recovered during a predetermined portion of the next drive cycle of the vehicle 10. The energy recovered from regenerative braking of the vehicle 10 involves capturing the kinetic energy of the vehicle 10 during braking of the vehicle 10 and storing the energy in the HV battery 20. The electric generator 30 of FIG. 2 can be used to convert the kinetic energy of the vehicle 10 into electric energy for the EDS 40 to transfer to the HV battery 20. The controller 42 and/or the VSC/PCM 26 may be used to determine the predicted energy recovered profile based on a number of information or inputs, such as information from blocks 74, 76, 78, and 80.

To determine the drive cycle of the vehicle 10, the system can predict the type of road that the vehicle 10 is expected to drive on as well as the level of traffic congestion that the vehicle 10 is expected to experience. This information can then be used as part of an overall strategy to determine the target SOC to charge the HV battery 20. The LD or controller 42 may obtain the information or inputs either internally or from a signal that the controller 42 and/or the VSC/PCM 26 receives externally, such as from the TCM 46 or the ECU 48.

At block 74, information indicating a future destination is obtained. The information indicating the future destination may be stored in memory in the vehicle 10, such as by a future driver of the vehicle 10, or predicted via calculations of prior driving history or patterns. For example, the VSC/PCM 26 may obtain a schedule of when and/or where the vehicle 10 is expected to be driven to predict when the vehicle 10 will be driven. The schedule may be stored in memory 52 and allow the VSC/PCM 26 to calculate how far the vehicle 10 is expected to be driven in one or more future drive cycles.

With continuing reference to block 74, the future destination information may include one or more future topographic routes that the vehicle 10 may transverse to reach the destination. Information about a topographic route can include information about how much regenerative braking energy can be expected to be recovered based on physical characteristics the vehicle 10, (e.g., mass of the vehicle 10 and its contents), the speed of traffic flow along the expected topographic route, the grade or degree of inclination of the driving route including uphill grades and downhill grades, historic driving information of the vehicle 10 or other automotive vehicles that have previously driven the one or more roads that the vehicle 10 may travel to reach its destination. Based on the future destination information, the controller 42 and/or the VSC/PCM 26 can determine the profiles of energy expected to be used and to be recovered during the next drive cycle of the vehicle 10.

At block 76, energy usage information from one or more previous drive cycles of the vehicle 10 is obtained. The information indicating the previous drive cycles may be stored into memory in the vehicle 10. The controller 42 may be an intelligent logic device that can accurately predict one or more driving patterns prior to starting a drive cycle of the vehicle 10 based on information from one or more previous drive cycles and the future destination information. The prediction strategy may use a neural network to receive historic vehicle speed profiles and other related signals. For example, the controller 42 may include a neural network to predict road type, traffic congestion levels, and other road environment information to train the neural network based on online prediction of road type and traffic congestion level in a future drive cycle based on the future destination information.

At block 78, time information is obtained.

The VSC/PCM 26 can obtain the time information from a clock or a signal input to the VSC/PCM 26. Block 74 and/or block 76 may use the time information to determine the expected future destination, which may change depending on the time of day, day of the week, time of the year, et cetera. In addition, the time information may be used at blocks 74, 76 to select among the energy usage information from one or more previous drive cycles of the vehicle 10. For example, the time information may be used to select energy usage information at similar diving times as when the vehicle 10 is expected to be driven. In another example, the time information may be used to determine expected traffic levels for the future drive cycle, which may change depending on the time of day, day of the week, etc. In short, the time information can increase the accuracy of determining the profiles of energy expected to be used and to be recovered during the next drive cycle of the vehicle 10.

At block 80 of FIG. 4, current location information is obtained. The VSC/PCM 26 may estimate or obtain the information indicating the current location from any suitable source, such as a positioning unit (e.g., GPS) or other wireless communication device, depending on the configuration of the controller 42 and/or VSC/PCM 26 in the vehicle 10.

At block 82, total predicted energy needed for the next drive cycle of the vehicle 10 is determined. The total predicted energy needed is based on the predicted energy usage profile and the predicted energy recovered profile. For example, the total predicted energy needed may be equal to the total energy usage predicted during the next drive cycle minus the total energy recovered predicted during the next drive cycle minus the current SOC of the HV battery 20. The VSC/PCM 26 either alone or in combination with the TCM 46 and/or ECU 48 may be used to determine the total predicted energy needed for the next drive cycle.

At decision block 84, the total predicted energy needed for the next drive cycle is compared to a predetermined energy level needed to optimize battery life. The predetermined energy level needed to optimize battery life represents a charge level where the HV battery 20 is not substantially power limited in recovering regenerative braking energy. For example, the predetermined energy level needed to optimize battery life may be ninety-three percent (93%). The ability to recover regenerative braking energy and store it in the HV battery 20 may be at least partially limited above the predetermined energy level needed to optimize battery life. The BCM 24 can be used to determine or calculate the predetermined energy level needed to optimize battery life based on, for example, the type of HV battery 20, the operating characteristics of the HV battery 20, and/or historic performance information of the HV battery 20, such as the charge rate of the HV battery 20 at various SOCs. The VSC/PCM 26 and/or the BCM 24 may obtain the predetermined energy level prior to each drive cycle of the vehicle 10 or as a predetermined value stored in memory depending on the implementation of the method and/or configuration of the system.

Referring again to decision block 84 of FIG. 4, the controller 42 and/or the VSC/PCM 26 may be used to compare the total predicted energy needed for the next drive cycle to the predetermined energy level needed to optimize battery life. For example, the controller 42 may determine whether the total predicted energy needed for the next drive cycle is greater than the predetermined energy level needed to optimize life of the HV battery 20. If the total predicted energy needed for the next drive cycle is less than or equal to the predetermined energy level needed to optimize battery life, then block 86 occurs. However, if the total predicted energy needed for the next drive cycle is greater than the predetermined energy level needed to optimize battery life, then block 88 occurs.

At block 86, the target SOC is determined or set to be equal to an upper charge level of a predetermined range of charge levels that optimize life of the HV battery 20. The predetermined range of charge levels that optimize life of the HV battery 20 represents a range of charge levels where the HV battery 20 is not power limited in terms of charging or recharging and, therefore, has a relatively high charge rate when the HV battery 20 is charging from the external power source 14. The upper charge level represents a charge level that optimizes life of the HV battery 20 when using electric power from the external power source 14 to charge the HV battery 20. For example, the upper charge level may be ninety percent (90%) of a predetermined range of charge levels of 10% to 90%. The upper charge level related to charging from the external power source 14 may be greater than, equal to, or less than the predetermined energy level related to recovering regenerative braking energy.

Referring again to block 86, the BCM 24 can be used to determine or set the upper charge level based on, for example, temperature information about the external temperature of the vehicle 10, the type of HV battery 20, the operating characteristics of the HV battery 20, information about electric power provided by the external power source 14, and/or historic performance information of the HV battery 20, such as charge rates of the HV battery 20 at different SOCs. The VSC/PCM 26 and/or the BCM 24 may obtain the upper charge level prior to each drive cycle of the vehicle 10. For example, the VSC/PCM 26 and/or the BCM 24 may determine various potential charge rates that may be obtained to charge the HV battery 20 during the next drive cycle based on the profiles of regenerative braking energy expected to be recovered and to be used during the portion of the future drive cycle. And based the potential charge rates during the next drive cycle, the VSC/PCM 26 and/or the BCM 24 may calculate the upper charge level for the HV battery 20. For example, the upper charge level for the HV battery 20 may be calculated as being inversely proportional to the weighted average of the charge rates predicted for the next drive cycle. Alternatively, the VSC/PCM 26 and/or the BCM 24 may obtain the upper charge level as a predetermined value stored in memory depending on the implementation of the method and/or configuration of the system.

Furthermore, the controller 42 and/or the VSC/PCM 26 may be used to determine or set the target SOC to be equal to the upper charge level.

At block 88, a minimum charge level required to meet the total predicted energy needed for the next drive cycle of the vehicle 10 is determined. The minimum charge level is a charge level that allows the HV battery 20 to supply enough electric power to the EDS 40 to propel the vehicle 10 to its future destination without depleting the electric charge of the HV battery 20 below a predetermined lower amount, such as, for example, five percent (5%). The controller 42 and/or the VSC/PCM 26 may be used to determine the predetermined lower amount based on the future destination information, energy usage information from one or more previous drive cycles of the vehicle 10, time information, current location information, as well as other information indicating how far the vehicle 10 can travel within a certain error factor without completely depleting the HV battery 20 to inhabit travel of the vehicle 10. The minimum charge level may be the lower charge level of the predetermined range of charge levels obtain at block 86. The controller 42 and/or the VSC/PCM 26 may be used to determine the minimum charge level required to meet the total predicted energy needed for the next drive cycle.

At decision block 90, it is determined whether an initial portion of the next drive cycle is predicted to primarily expand energy. When energy is primarily expanded during a particular time interval of a drive cycle of the vehicle 10, the amount of energy used is greater than the amount of energy recovered through regenerative braking during the particular time interval. The controller 42 and/or the VSC/PCM 26 can determine whether the initial portion of the next drive cycle is predicted to primarily expand energy based on the predicted energy usage profile and the predicted energy recovered profile. For example, the controller 42 may determine whether the initial portion of the next drive cycle is predicted to primarily expand energy if the sum of predicted energy usage during the initial portion of the next drive cycle exceeds the sum of predicted energy recovered during the initial portion of the next drive cycle. If the initial portion of the next drive cycle is not predicted to primarily expand energy, then block 92 occurs. On the other hand, if the initial portion of the next drive cycle is predicted to primarily expand energy, then block 94 occurs.

At block 92, the target SOC is determined to be above the minimum charge level, but at a level below where regenerative braking may be at least partially limited (e.g., less than 93%). This allows the HV battery 20 to recover regenerative braking energy during the initial portion of the next drive cycle. The controller 42 and/or the VSC/PCM 26 may be used to determine or set the target SOC above the minimum charge level, but at a level below where regenerative braking may be at least partially limited.

At block 94, the target SOC is determined to be or set at the minimum charge level. The controller 42 and/or the VSC/PCM 26 may be used to determine or set the target SOC at the minimum charge level.

The control strategies or logic illustrated in FIGS. 3-4 may be implemented by one or more logic arrays and/or a microprocessor based computer or controller. When implemented by a microprocessor based controller, the control strategy may include instructions or code processed using any of a number of known strategies such as event-driven, interrupt-driven, multi-tasking, multi-threading, and the like. Whether implemented primarily in code or hardware devices, various steps or functions illustrated may be performed in the sequence illustrated, in a difference sequence, in parallel, or in some cases omitted. Although not explicitly illustrated, one of ordinary skill in the art will recognize that one or more of the illustrated functions may be repeatedly performed depending upon the particular implementation. Similarly, the order of processing is not necessarily required to achieve the described features and advantages, but is provided for ease of illustration and description.

The control logic may be implemented in software, hardware, or a combination of software and hardware in one or more controllers and/or electronic devices depending upon the particular application. When implemented in software, the control logic is preferably provided in one or more computer-readable storage media having stored data representing code or instructions executed by a computer to control charging. The computer-readable storage media may include one or more of a number of known physical devices which utilize electric, magnetic, optical, and/or hybrid storage to keep executable instructions and associated calibration information, operating variables, and the like.

Figure 5:
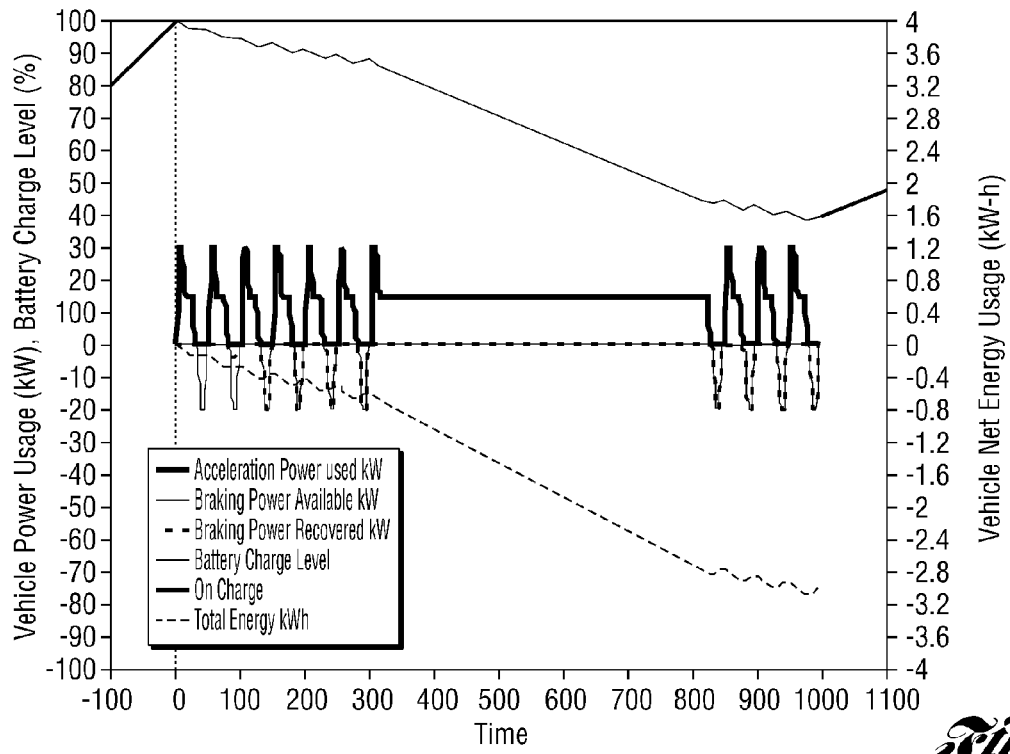
FIG. 5 is a diagram illustrating charge levels of the storage battery (%) and power usage levels of the electric vehicle (kW) at different times during a drive cycle starting with the storage battery at a 100% charge level.

With reference to FIG. 5, a diagram illustrates charge levels of the HV battery 20 and power usage levels of the vehicle 10 at different times during a drive cycle that starts with the HV battery 20 at a 100% charge level. The drive cycle of FIG. 5 has a duration of approximately 1000 seconds. As shown between −100 and 0 seconds (i.e., before the drive cycle), the HV battery 20 is "on charge" and electric power is being transferred from the external power source 14 to the HV battery 20 to increase the SOC of the HV battery 20 from 80% at −100 seconds to 100% at time zero.

As shown FIG. 5, the vehicle 10 is "off charge" between 0 and 350 seconds and has a drive cycle characterized by seven acceleration and six braking sequences, a steady acceleration power interval between 350 and 800 seconds, and then four braking and three acceleration sequences between 800 and 1000 seconds.

Figure 6:
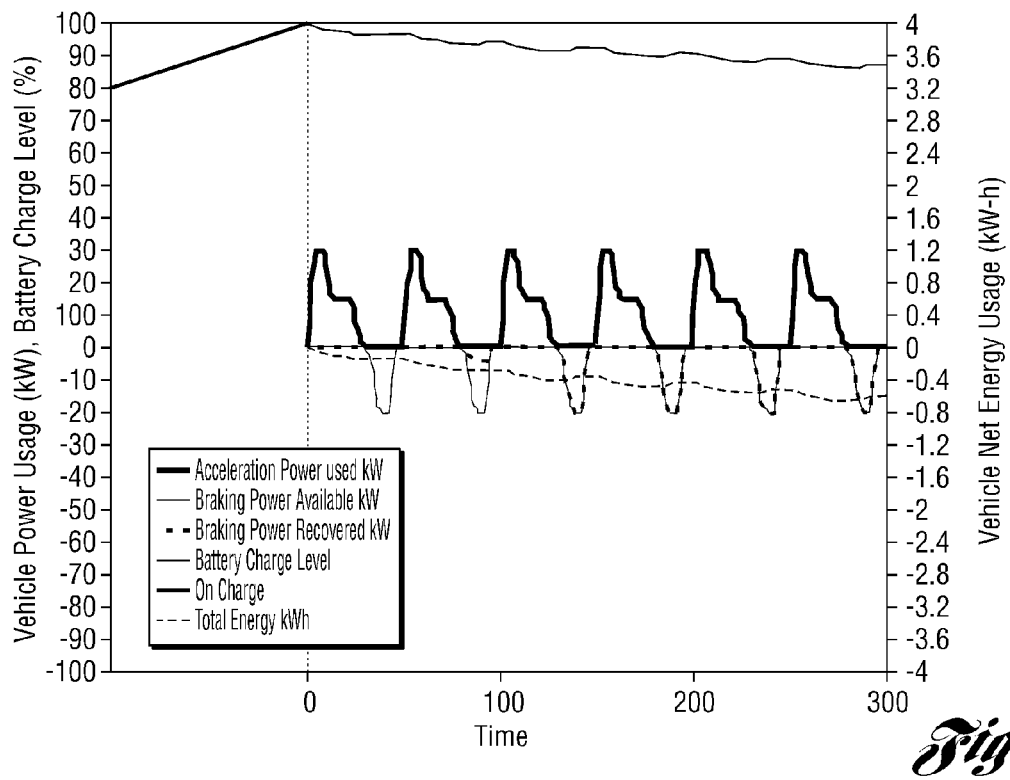
FIG. 6 is a diagram illustrating an initial portion of the drive cycle shown in FIG. 5 and the storage battery not recovering all of the regenerative braking energy during the first two vehicle stops due to the storage battery being charge limited.

FIG. 6 is a diagram illustrating an initial portion of the drive cycle shown in FIG. 5. While the initial portion of the drive cycle is shown to have a duration of approximately 300 seconds, the initial portion may have a longer or shorter duration. The controller 42 and/or the VSC/PCM 26 may determine the duration of the initial portion of the drive cycle of the vehicle 10 based on various information, such as the predicted profiles of energy usage and energy recovered.

As shown in FIGS. 5-6, the HV battery 20 does not recover all of the regenerative braking during the first two stops of the vehicle 10 where the absolute braking power available increases (i.e., between 20 and 100 seconds). The HV battery 20 may not recover all of the regenerative braking energy due to the HV battery 20 being charge limited. The HV battery 20 is charge limited above a SOC of 93%, as shown in FIG. 6, and therefore has a reduced or limited charge rate that the HV battery 20 can increase its SOC using regenerative braking energy.

As illustrated in FIGS. 5-6, the braking power recovered is approximately zero between 20 and 50 seconds, and therefore the charge rate of the HV battery 20 is approximately zero. Between 70 and 100 seconds the SOC of the HV battery 20 decreases, such as when the HV battery 20 provides acceleration power to drive the electric motor 32 and/or the electric generator 30, and the HV battery 20 is less charge limited than between 20 and 50 seconds. Consequently, the HV battery 20 is able to recover some regenerative braking energy or "braking power recovered" between 70 and 100 seconds, but not as much regenerative braking energy during stops three, four, five, and six, which occur between 120 and 300 seconds as shown in FIGS. 5-6. The SOC of the HV battery 20 is reduced during stops three, four, five, and six to a level where the HV battery 20 is not charge limited. When the HV battery 20 is not charge limited, the HV battery 20 has full charge power capability and is able to recover regenerative braking energy at its maximum charge rate. Thus, as shown during stops three, four, five, and six, the braking power recovered matches the braking power available so the HV battery 20 is able to recover substantially all the potential regenerative braking energy available during the drive cycle.

FIG. 7 is a diagram similar to FIG. 5, but illustrating the HV battery 20 at a 90% charge level prior to starting the drive cycle in accordance with one embodiment. Like FIG. 5, the drive cycle of FIG. 7 has a duration of approximately 1000 seconds with the time interval between −100 and 0 seconds representing when the HV battery 20 is "on charge" with electric power transferring from the external power source 14 to the HV battery 20 to increase the SOC of the HV battery 20. Unlike FIG. 5 where the SOC of the HV battery 20 increases from 80% to 100%, the diagram of FIG. 7 shows the SOC of the HV battery 20 increasing from 70% to 90%.

FIG. 8 is a diagram illustrating an initial portion of the diagram of FIG. 7 showing the HV battery 20 recovering substantially all of the regenerative braking energy during the first two stops of the vehicle 10 without the HV battery 20 being charge limited as in FIGS. 5-6.

As shown FIGS. 7-8, the vehicle 10 is "off charge" between 0 and 350 seconds and has a drive cycle characterized by seven acceleration and six braking sequences, a steady acceleration power interval between 350 and 800 seconds, and then four braking and three acceleration sequences between 800 and 1000 seconds. However, the HV battery 20 is not at full capacity at the start of the drive cycle, which allows the HV battery 20 to recover regenerative braking energy at its maximum charge rate at each of the stops in the drive cycle shown in FIG. 7. Consequently, the HV battery 20 is not charge limited. Thus, as shown during stops one through six, the braking power recovered matches the braking power available and the HV battery 20 is able to recover nearly all the potential regenerative braking energy. As a result, the net energy used during stop one through six can be approximately 0.5 kW-h when nearly all of the potential regenerative braking energy is recovered as illustrated in FIG. 8 at 300 seconds. Comparatively, the net energy used during stop one through six can be approximately 0.6 kW-h when the potential regenerative braking energy is not completely recoverable as illustrated in FIG. 6 at 300 seconds. Accordingly, the net or total energy used for the entire drive cycle can be approximately 2.8 kW-h when nearly all of the potential regenerative braking energy is recovered as illustrated in FIG. 7 at 1000 seconds and approximately 2.9 kW-h when the potential regenerative braking energy is not completely recoverable as illustrated in FIG. 6 at 1000 seconds. This result of lower energy usage for a particular drive cycle emphasizes one of the potential advantages of not charging to SOC levels while "on charge" which can limit a regenerative braking charge rate at the initial portion of the drive cycle.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method of charging a battery in a vehicle prior to beginning a drive cycle, the method comprising:
controlling, by a controller, battery charging from a power source external to the vehicle based on a profile of regenerative braking energy expected to be recovered during a portion of a future drive cycle of the vehicle and a profile of energy expected to be used from the battery during the portion of the future drive cycle.

2. A method of charging a battery in an electric vehicle using electric power from a power source external to the electric vehicle, the method comprising:
controlling, by a controller, prior to a drive cycle, charging of the battery to a target state of charge based on a profile of regenerative braking energy expected to be recovered during a portion of a future drive cycle of the electric vehicle and a profile of energy expected to be used from the battery during the portion of the future drive cycle.

3. The method of claim 2 wherein the target state of charge is further based on an amount of regenerative braking energy expected to be recovered in an initial portion of the future drive cycle.

4. The method of claim 3 wherein the initial portion of the future drive cycle is the portion of the future drive cycle from the beginning of the drive cycle to a time interval where the profile of energy expected to be used from the battery substantially exceeds the profile of regenerative braking energy expected to be recovered within the time interval.

5. The method of claim 3 further including controlling, by the controller, a charge rate to charge the battery during the initial portion of the future drive cycle based on the regenerative braking energy expected to be recovered during the initial portion and wherein the target state of charge is further based on the charge rate.

6. The method of claim 5 wherein the charge rate to charge the battery during the initial portion of the future drive cycle is further based on an amount of battery energy required to complete the future drive cycle.

7. The method of claim 2 further including controlling, by the controller, a charge rate to charge the battery based on the regenerative braking energy expected to be recovered and wherein the target state of charge is further based on the charge rate.

8. The method of claim 7 wherein the target state of charge is inversely proportional to the charge rate.

9. The method of claim 2 wherein the target state of charge is an upper limit of a predetermined operating range of state of charge when the upper limit provides at least an amount of battery energy required to complete the future drive cycle.

10. The method of claim 9 wherein the target state of charge maximizes an amount of time that the battery operates in the predetermined operating range of state of charge during the future drive cycle.

11. The method of claim 10 wherein the predetermined range of state of charge is between ten percent (10%) and ninety percent (90%) of a maximum state of charge of the battery.

12. The method of claim 2 wherein the target state of charge maximizes the amount of regenerative braking energy that the vehicle captures during the future drive cycle.

13. The method of claim 2 further including processing information indicating an expected travel path of the vehicle during the drive cycle and wherein the profile of regenerative braking energy expected to be recovered and the profile of energy expected to be used are based on the expected travel path.

14. The method of claim 13 wherein the information indicating the expected travel path includes information indicating lengths and grades for respective sections of the expected travel path and wherein the profile of regenerative braking energy expected to be recovered and the profile of energy expected to be used are based on the lengths and the grades.

15. The method of claim 13 wherein the information indicating the expected travel path of the vehicle is based on one or more user inputs including information indicating an intended destination of the vehicle.

16. The method of claim 13 wherein the information indicating the expected travel path of the vehicle is based on amounts of regenerative braking energy recovered during previous drive cycles of the vehicle occurring along at least a portion of the expected travel path.

17. The method of claim 16 wherein the information indicating the expected travel path of the vehicle is based on a time of day when the amounts of regenerative braking energy were recovered.

18. The method of claim 16 wherein the information indicating the expected travel path of the vehicle is based on a day of week when the amounts of regenerative braking energy were recovered.

19. A system comprising:
at least one logic device configured to charge a storage battery in a vehicle prior to starting a drive cycle of the vehicle using electric power from a power source external to the vehicle to a target state of charge based on a profile of regenerative braking energy expected to be recovered during a portion of a future drive cycle of the vehicle and a profile of energy expected to be used from the battery during the portion of the future drive cycle.

20. The system of claim 19 wherein the logic device is a controller including a processor operable to execute software instructions, a computer memory operable to store software instructions accessible by the processor, and a set of software instructions stored in the memory to charge the storage battery to the target state of charge using electric power from the external power source.

* * * * *